(12) United States Patent
McQuirk et al.

(10) Patent No.: US 7,236,014 B1
(45) Date of Patent: Jun. 26, 2007

(54) CIRCUIT AND METHOD FOR PEAK DETECTION OF AN ANALOG SIGNAL

(75) Inventors: Dale J. McQuirk, Austin, TX (US); Michael A. Bourland, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 11/297,191

(22) Filed: Dec. 7, 2005

(51) Int. Cl.
G01R 19/00 (2006.01)
H03K 5/153 (2006.01)

(52) U.S. Cl. .......................................... 327/58; 327/60
(58) Field of Classification Search .................. 327/50, 327/58, 62, 63, 65, 90, 91
See application file for complete search history.

(56) References Cited

U.S. PATENT DOCUMENTS

| 4,355,285 A | 10/1982 | Kelley et al. | |
|---|---|---|---|
| 4,565,971 A | 1/1986 | Brookshire | |
| 4,697,152 A | 9/1987 | Westwick | |
| 5,463,211 A * | 10/1995 | Arends et al. | 235/462.27 |
| 6,051,998 A * | 4/2000 | Lee et al. | 327/59 |
| 6,720,812 B2 * | 4/2004 | Tumer et al. | 327/170 |
| 6,965,257 B2 * | 11/2005 | Tanaka | 327/58 |

* cited by examiner

*Primary Examiner*—Dinh T. Le
(74) *Attorney, Agent, or Firm*—Daniel D. Hill; Robert L. King

(57) ABSTRACT

A fully differential peak detection circuit includes programmable sensitivity and an autozero function. The peak detector has a fully differential charge-coupled analog signal path. The entire analog signal path is autozeroed upon enable and/or in response to sensing a logic zero at the output, where the logic zero follows a logic one. The peak detector includes a differential gain stage for receiving an analog input signal. The differential gain stage includes offset error compensation. The offset error compensation is selected upon enable and/or in response to an output signal of the peak detection circuit and automatically zeros an offset error voltage in response to a predetermined logic state of the output signal. The output of the gain stage is provided to a comparator stage. A plurality of capacitors coupled to the comparator stage stores a predetermined voltage for setting a sensitivity of the peak detector. The sensitivity is programmable during an autozero sequence by applying a predetermined voltage to the plurality of capacitors.

20 Claims, 2 Drawing Sheets

CIRCUIT AND METHOD FOR PEAK DETECTION OF AN ANALOG SIGNAL

FIELD OF THE INVENTION

This invention relates generally to circuits and more specifically to a circuit and method for peak detection of an analog signal.

BACKGROUND

One form of a peak detector is a circuit that senses the amplitude of a time varying signal and provides a logic one output if the amplitude is greater than a predetermined value and a logic zero output if the amplitude is less than the predetermined value. One common implementation of the peak detector comprises an amplifier with feedback and an integrator. Various sources for error are associated with the amplifier and noise can be introduced into different parts of the circuit. Offset error compensation is used to reduce some of the effects of the error. However, in some applications the peak detector will not function reliably because the signal level is smaller than the potential offsets and errors in the amplifier. Also, the integrator can introduce error and/or uncertainty in the logic output.

Therefore, it is desirable to provide a peak detector circuit that can convert small signal levels and compensate for error.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates identical items unless otherwise noted.

DETAILED DESCRIPTION

Generally, the present invention provides, in one embodiment, a fully differential peak detection circuit with programmable sensitivity and an auto zero function. The peak detector has a fully differential charge-coupled analog signal path. The entire analog signal path is auto zeroed upon enable and/or in response to sensing a logic zero at the output, where the logic zero follows a logic one. The peak detector includes a differential gain stage for receiving an analog input signal. The differential gain stage includes offset error compensation. The offset error compensation may be selected in response to an output signal of the peak detection circuit and automatically zeros an offset error voltage in response to a transition to a predetermined logic state of the output signal. The output of the gain stage is provided to a comparator stage. A plurality of capacitors coupled to the comparator stage stores a predetermined voltage for setting the sensitivity of the peak detector. The sensitivity is programmable during an autozero sequence by applying a predetermined voltage to the plurality of capacitors.

The disclosed peak detection circuit provides a large input impedance while maintaining small size, low power operation and high precision.

The following sets forth a detailed description of a mode for carrying out the invention. The description is intended to be illustrative of the invention and should not be taken to be limiting.

Figure 1:
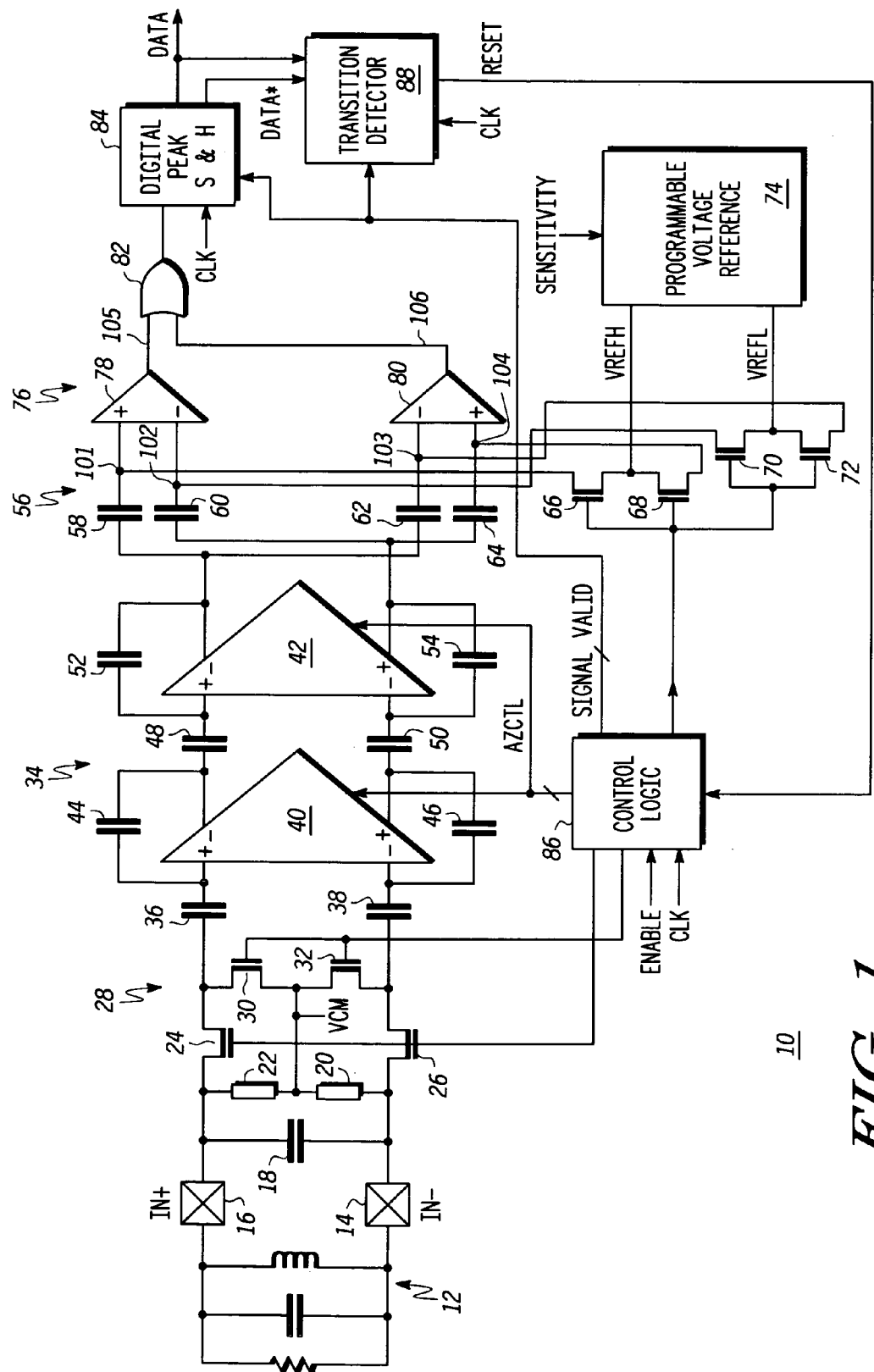
FIG. 1 illustrates, in partial schematic diagram form and partial block diagram form, a peak detection circuit in accordance with an embodiment of the present invention.

FIG. 1 illustrates, in partial schematic diagram form and partial block diagram form, a peak detection circuit 10 in accordance with an embodiment of the present invention. Peak detection circuit 10 includes pads 14 and 16, capacitor 18, transistors 24 and 26, common mode switch 28, amplifier stage 34, programmable sensitivity circuit 56, comparator stage 76, logic gate 82, digital peak sample and hold circuit 84, auto zero control logic 86 and transition detector 88. Common mode switches 28 includes N-channel transistors 30 and 32 and resistors 20 and 22. Amplifier stage 34 includes operational amplifiers 40 and 42 and capacitors 36, 38, 44, 46, 48, 50, 52, and 54. Programmable sensitivity circuit 56 includes capacitors 58, 60, 62, and 64, transistors 66, 68, 70, and 72 and programmable voltage reference circuit 74.

One embodiment of the peak detector 10 allows it to function as a low frequency magnetic induction communications receiver, where low frequency is defined as frequencies below 10 mega hertz (MHz). More specifically, the peak detector 10 is implemented on an integrated circuit microcontroller used as a tire pressure monitor for a motor vehicle. An antenna 12, represented by a resistor, a capacitor, and an inductor, is coupled across the pads 14 and 16 for sensing a magnetic field. The antenna 12 provides a differential input signal labeled "IN+" and "IN−" to pads 14 and 16 in a scaled form. Capacitor 18 is a decoupling capacitor. The resistors 20 and 22 are both high resistance resistors and function to set a common mode voltage of the antenna 12. Common mode switch 28 includes transistors 30 and 32 coupled between the signal lines. The common mode switch 28 functions to couple a common mode voltage labeled "VCM" to the signal lines in response to a control signal from the control logic 86.

The peak detector 10 is enabled for operation when enable signal ENABLE is asserted by a microcontroller as a logic high. During a sensing operating mode the transistors 24 and 26 are made conductive to couple the pads 14 and 16 to the input terminals of the operational amplifier 40 of amplifier stage 34. The amplifier stage 34 includes two gain stages. Other embodiments may have one or more gain stages. Also, other embodiments may have programmable gain. The positive output terminal of operational amplifier 42 is coupled to capacitors 60 and 64, and the negative output terminal of operational amplifier 42 is coupled to capacitors 58 and 62. Comparator 78 has a positive input labeled node 101 coupled to capacitor 58 and a negative input labeled node 102 coupled to capacitor 60. Comparator 80 has a positive input labeled node 104 coupled to capacitor 64 and a negative input labeled node 103 coupled to capacitor 62. The use of two comparators allows both positive and negative peaks to be detected in the illustrated embodiment. In other embodiments, only one comparator may be used if detection of both positive and negative peaks is not necessary. A predetermined voltage is provided to the capacitors 58, 60, 62, and 64 to set a threshold voltage for determining when the amplitude of the difference of analog input signals IN+ and IN− is to be considered a logic one or a logic zero. Both of the comparators 78 and 80 provides a digital input representing the logic state of the analog input signals IN+ and IN− to input terminals of OR logic gate 82. An output of OR logic gate 82 is provided to an input of digital peak sample-and-hold circuit 84. Digital peak sample-and-hold circuit 84 has an output for providing a data signal labeled "DATA" and a data signal labeled DATA*, where DATA* is a logical complement of DATA. In the illustrated embodiment, the data signal DATA represents the logic value of the demodulated analog data inputs IN+ and IN− and is provided for use directly or for further decoding. Each time the amplitude of input signals IN+ and IN− exceeds a predetermined threshold voltage, as determined by the voltage stored on capacitors 58, 60, 62, and 64, data signal DATA is provided as a logic one. Whether used either directly or after additional decoding, the data signal DATA can then be used to provide an interrupt to a microcontroller. In other embodiments, the data signal DATA may be provided for other uses, such as for programming or reprogramming non-volatile memory in the field or during manufacturing.

Figure 3:
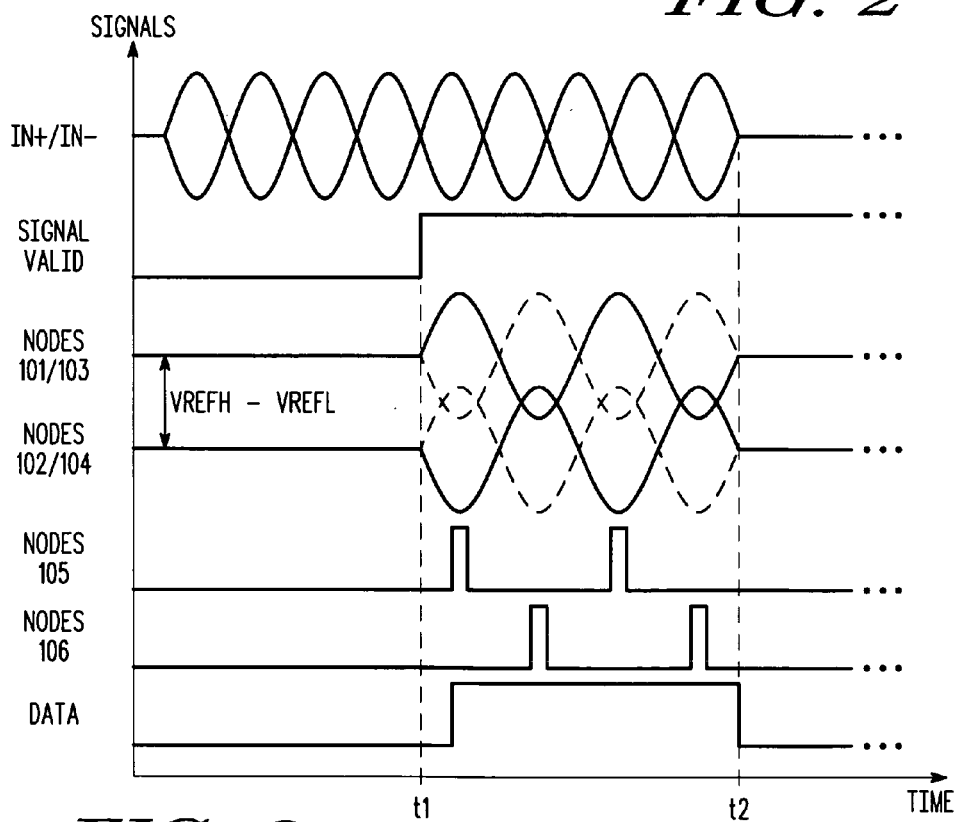
FIG. 3 illustrates a timing diagram of various signals of the peak detection circuit of FIG. 1.

The peak detector circuit 10 is autozeroed upon input signal ENABLE being asserted high and/or each time the data signal DATA transitions from a logic one to a logic zero. Note that in another embodiment, the circuit 10 may be used to detect the absence of a signal. Transition detector 88 monitors the data signals DATA and DATA* and provides a signal labeled "RESET" to control logic 86 when signal DATA transitions to a logic zero. In response to the ENABLE or RESET signals, the control logic 86 provides a logic low signal to the gates of transistors 24 and 26 to cause transistors 24 and 26 to be substantially non-conductive to isolate the amplifier stage 34 from antenna 12. Also, the operational amplifiers 40 and 42 are autozeroed by control signals AZCTL. For example, the inputs and outputs of operational amplifiers 40 and 42 are coupled to sources of potential (not shown). Then, control logic 86 causes transistors 30 and 32 to be conductive to equalize the differential input path at the common mode voltage VCM. In one embodiment VCM is connected to ground. In other embodiments VCM may be coupled to another potential. Also, during the autozero operation, the voltage on capacitors 58, 60, 62, and 64 are charged to the predetermined voltage. A difference of a reference voltage labeled "VREFH" and a reference voltage labeled "VREFL" is used to set the peak threshold voltage for detecting a logic one as illustrated in FIG. 3 and discussed later. The reference voltages VREFH and VREFL are provided by programmable voltage reference 74. In the illustrated embodiment, the voltage reference 74 is implemented using a voltage divider having multiple taps which are chosen in response to a control signal labeled "SENSITIVITY". In one embodiment, control signal SENSITIVITY is a plurality of signals. In other embodiments, the programmable voltage reference 74 may be any other type of reference voltage generator. The high reference voltage VREFH is coupled to capacitors 58 and 64 by transistors 66 and 68 in response to a control signal from control logic 86. Likewise, the low reference voltage VREFL is coupled to capacitors 60 and 62 by transistors 70 and 72 in response to the control signal from control logic 86. In addition, when the signal SIGNAL VALID is not asserted the digital peak sample-and-hold 84 will provide signal DATA at a predetermined known voltage during the autozero operation. During the autozero operation the signal SIGNAL VALID remains deasserted while control signals AZCTL are sequenced in response to the assertion of signals RESET or ENABLE. Following the autozero operation, the signal SIGNAL VALID is asserted to enable the digital peak sample and hold circuit 84 to provide a DATA signal in response to analog input signals IN+ and IN−. The refreshing of the offset error compensation upon the assertion of signal RESET allows long term precision operation of the peak detector 10. Note that control logic 86, digital peak sample and hold circuit 84, and transition detector 88 each receive a clock signal labeled "CLK".

Figure 2:
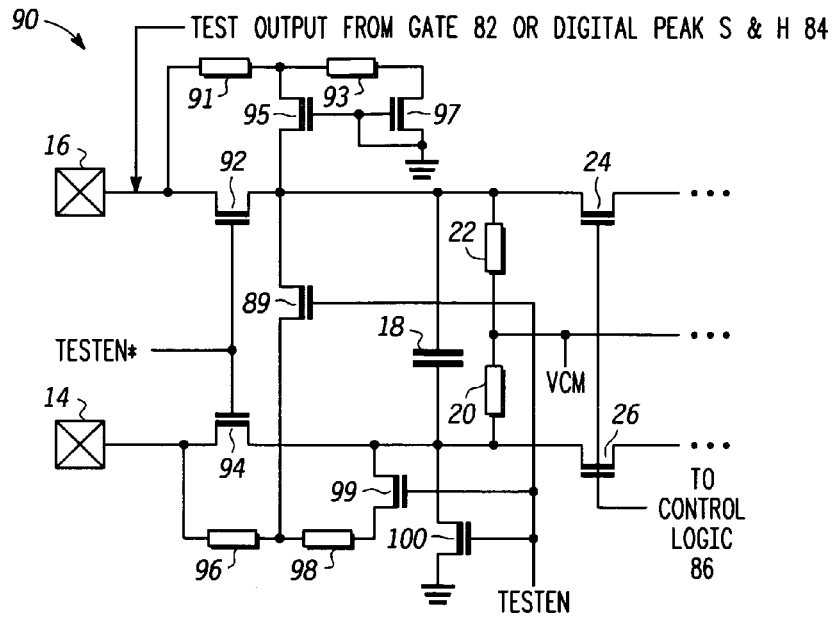
FIG. 2 illustrates, in partial schematic diagram form and partial block diagram form, a circuit for testing the peak detection circuit of FIG. 1.

FIG. 2 illustrates, in partial schematic diagram form and partial block diagram form, a circuit 90 for testing the peak detection circuit 10 of FIG. 1. Note that in the drawings the same reference numbers are used for the same or similar elements. The circuit 90 allows the differential signal path of peck detection circuit 10 to be tested using only a single-ended signal provided at one of pads 14 and 16. Circuit 90 includes transistors 89, 92, 94, 95, 97, 99, and 100, and resistors 91, 93, 96, and 98. During testing a test signal labeled TESTEN* is asserted as a logic low to cause transistors 92 and 94 to be substantially non-conductive. Test signal TESTEN is asserted as a logic high and causes transistors 89, 99, and 100 to be conductive to provide a signal path from pad 14 through a resistor divider made up of resistors 96 and 98 to substantially scale the input signal level to a lower magnitude signal and to provide a conversion from single-ended to differential. Resistors 91 and 93 and transistors 95 and 97 provide impedance matching to reduce error. Transistors 24 and 26 are made conductive or substantially non-conductive as needed by control logic 86. As a result of using a single-ended input 14, input pad 16 is freed for use as an output during testing. In one embodiment, the output path to input pad 16 can be used to monitor the output of either gate 82 or digital peak sample-and-hold 84.

FIG. 3 illustrates a timing diagram of various signals of the peak detection circuit of FIG. 1. Prior to time t1, a time varying, relatively low amplitude, differential input signal IN+/IN− is transitioning on input pads 14 and 16. An enable signal ENABLE (FIG. 1) transitions to a logic one which enables peak detector 10 to begin detecting the transitions. Prior to time t1 signal SIGNAL VALID remains at a logic low until after an autozero operation is completed. The autozero operation sets a voltage difference (VREFH−VREFL) between nodes 101 and 102 and nodes 103 and 104. Also, signal DATA is held at a known voltage. At time t1, SIGNAL VALID becomes a logic high allowing signal DATA to begin reflecting valid peak detections. The amplifier stage 34 drives a differential signal onto a plurality of capacitors 58, 60, 62, and 64. A solid line represents the voltage on one node of nodes 101/103 and nodes 102/104, while a dashed line represents the voltage on the other node. Where the solid lines cross, as illustrated in FIG. 3, indicates a peak above the predefined threshold and a logic one is provided on node 106. Likewise, where the solid lines do not cross indicates a peak below the predefined threshold and a logic zero is provided on node 106. Similarly, where the dashed lines cross, as illustrated in FIG. 3, indicates a peak above the predefined threshold and a logic one is provided on node 105. Likewise, where the dashed lines do not cross indicates a peak below the predefined threshold and a logic zero is provided on node 105. Between times t1 and t2 digital peak sample-and-hold 84 monitors the output of logic gate 82 and provides a logic high signal DATA if the output of gate 82 continues to transition within some predetermined time period, and clears the signal DATA if the time between transitions is outside the predetermined time period. After time t2 the peaks of the amplifier input signals are below the peak threshold, thus beginning another autozero operation controlled by signal RESET (see FIG. 1).

While the invention has been described in the context of a preferred embodiment, it will be apparent to those skilled in the art that the present invention may be modified in numerous ways and may assume many embodiments other than that specifically set out and described above. For example, the conductivity types of the transistors may be reversed. Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A peak detection circuit comprising:
   an input section for receiving a differential input signal;
   a gain stage coupled to the input section that is fully differential and offset error compensated for providing an amplified differential signal;
   a plurality of capacitors coupled to the gain stage, each of the plurality of capacitors having a first electrode for receiving one of two outputs of the gain stage and having a second electrode;
   a voltage reference coupled to the plurality of capacitors for placing one of two predetermined reference voltages on the second electrode of each respective one of the plurality of capacitors;
   at least one comparator coupled to the plurality of capacitors, the at least one comparator providing a signal for indicating when the amplified differential signals exceeds a differential of the two predetermined reference voltages;
   a digital peak sample and hold circuit coupled to the at least one comparator for providing a predetermined data output value for a predetermined amount of time in response to the signals provided by the at least one comparator; and
   error compensation circuitry coupled to the digital peak sample and hold circuit and the gain stage, the error compensation circuitry provides selective automatic zeroing of offset error voltages of the gain stage when the digital peak sample and hold circuit has a predetermined transition of its digital output, said automatic zeroing occurs concurrently with placing the predetermined one of the two reference voltages on each respective second electrode of the plurality of capacitors.

2. The peak detection circuit of claim 1 wherein the error compensation circuitry further comprises:
   a transition detector having an input coupled to the digital peak sample and hold circuit, the transition detector being driven by the predetermined data output value and providing a reset signal for the error compensation circuitry; and
   control logic coupled to the transition detector and the gain stage, the control logic receiving the reset signal and performs an error compensation sequence on the gain stage.

3. The peak detection circuit of claim 1 wherein the plurality of capacitors further comprise capacitors having substantially equal amounts of capacitance.

4. The peak detection circuit of claim 1 wherein the gain stage further comprises:
   a first fully differential operational amplifier having a first input coupled to a first input of the differential input signal and a second input coupled to a second input of the differential input signal, the first fully differential operational amplifier having a first output and a second output; and
   a second fully differential operational amplifier having a first input coupled to the first output of the first fully differential operational amplifier and a second input coupled to the second output of the first fully differential operational amplifier, each of the first fully differential operational amplifier and the second fully differential operational amplifier having a gain determined by ratios of capacitance of coupling and feedback capacitors coupled to the first fully differential operational amplifier and the second fully differential operational amplifier.

5. The peak detection circuit of claim 1 wherein the input section further comprises:
   a first circuit pad for receiving a first of the differential input signal;
   a second circuit pad for receiving a second of the differential input signal; and
   switching circuitry coupled to the first circuit pad and the second circuit pad for disconnecting the differential input signal from the gain stage in response to the error compensation circuitry when automatically zeroing the offset error voltage.

6. The peak detection circuit of claim 1 wherein the input section receives a single ended input signal and converts the single ended signal to the differential input signal in scaled form.

7. The peak detection circuit of claim 6 wherein the input section further comprises:
   a first circuit pad;
   a second circuit pad for receiving the single ended input signal; and
   a resistive divider circuit coupled to the second circuit pad for converting the single ended input signal to the differential input signal and scaling a magnitude of the single ended input signal to a lower magnitude signal.

8. The peak detection circuit of claim 7 wherein the second circuit pad is an output pad for providing a test output signal having a value resulting from receiving a test input signal as the single ended input signal.

9. A method of detecting a peak in a signal comprising:
   providing an input for receiving a differential input signal;
   providing a fully differential gain stage to provide an amplified differential signal;
   coupling a plurality of capacitors to the fully differential gain stage, each of the plurality of capacitors having a first electrode for receiving one of two outputs of the fully differential gain stage and having a second electrode;
   coupling a voltage reference to the plurality of capacitors for placing one of two predetermined reference voltages on the second electrode of each respective one of the plurality of capacitors;
   coupling at least one comparator to the plurality of capacitors, the at least one comparator providing signals for indicating when the amplified differential signal exceeds a differential of the two predetermined reference voltages;
   coupling a digital peak sample and hold circuit to the at least one comparator for providing a predetermined data output value for a predetermined amount of time in response to the signals provided by the at least one comparator; and coupling error compensation circuitry to the digital peak sample and hold circuit and the gain stage, the error compensation circuitry providing selective offset error voltage compensation of the gain stage when the digital peak sample and hold circuit has a predetermined transition of its digital output, said offset error compensation occurs concurrently with placing the predetermined one of the two reference voltages on each respective second electrode of the plurality of capacitors.

10. The method of claim 9 further comprising:

coupling an input of a transition detector to the digital peak sample and hold circuit, the transition detector being driven by the predetermined data output value and providing a reset signal for the error compensation circuitry; and coupling control logic to the transition detector and the gain stage, the control logic receiving the reset signal and performing an error compensation sequence on the gain stage in response thereto.

11. The method of claim 9 further comprising sizing the plurality of capacitors to have substantially equal amounts of capacitance.

12. The method of claim 9 further comprising:

coupling a first input of a first fully differential operational amplifier to a first input of the differential input signal and coupling a second input thereof to a second input of the differential input signal, the first fully differential operational amplifier having a first output and a second output;

coupling a first input of a second fully differential operational amplifier to the first output of the first fully differential operational amplifier and coupling a second input thereof to the second output of the first fully differential operational amplifier; and coupling feedback and coupling capacitors to the first fully differential operational amplifier and the second fully differential operational amplifier, each of the first fully differential operational amplifier and the second fully differential operational amplifier having a gain determined by ratios of capacitance of the feedback and coupling capacitors.

13. The method of claim 9 further comprising:

providing a first circuit pad for receiving a first of the differential input signal;

providing a second circuit pad for receiving a second of the differential input signal; and coupling switching circuitry to the first circuit pad and the second circuit pad for disconnecting the differential input signal from the gain stage in response to the error compensation circuitry when compensating for offset error voltage.

14. The method of claim 9 further comprising:

receiving a single ended input signal and converting the single ended signal to the differential input signal in scaled form.

15. The method of claim 14 further comprising:

providing a first circuit pad;

providing a second circuit pad for receiving the single ended input signal; and coupling a resistive divider circuit to the second circuit pad for converting the single ended input signal to the differential input signal and scaling a magnitude of the single ended input signal to a lower magnitude signal.

16. The method of claim 15 further comprising:

coupling the second circuit pad as an output pad for providing a test output signal having a value resulting from receiving a test input signal as the single ended input signal.

17. A peak detection circuit comprising:

a fully differential gain stage having a first input for receiving a first differential signal, a second input for receiving a second differential signal, a first output for providing an amplified first differential output signal, and a second output for providing an amplified second differential output signal;

a signal sensitivity circuit coupled to the first output and the second output of the fully differential gain stage for adjusting a point at which a peak threshold exists;

at least one comparator coupled to the signal sensitivity circuit for indicating when a differential of the first output and the second output exceeds the peak threshold in a predetermined polarity;

circuitry for sampling an output of the at least one comparator and providing a digital output of predetermined value in response to a differential of the first differential signal and the second differential signal exceeding the peak threshold and maintaining the predetermined value as long as detection of exceeding the peak threshold continues within a predetermined time; and circuitry for offset voltage compensation coupled to the fully differential gain stage and to the circuitry for sampling, the circuitry for offset voltage compensation selectively performs offset voltage cancellation after detection of exceeding the peak threshold has occurred and subsided.

18. The peak detection circuit of claim 17 further comprising:

an input section coupled to the fully differential stage, the input section comprising a first circuit pad for receiving a data signal which is converted by the input section to the first differential signal and the second differential signal, the input section comprising a second circuit pad for providing a test output signal from the peak detection circuit in response to the data signal assuming a predetermined test value.

19. The peak detection circuit of claim 17 wherein the circuitry for offset voltage compensation performs offset voltage cancellation repetitively in response to receiving a stream of data at the first input and the second input of the fully differential gain stage for each occurrence of a peak detection and subsidence thereof.

20. The peak detection circuit of claim 17 wherein the at least one comparator further comprises a first comparator for determining if the differential between first output and the second output exceeds the peak threshold in a first polarity and comprises a second comparator for determining if the differential between first output and the second output exceeds the peak threshold in a second polarity opposite the first polarity.

* * * * *